United States Patent
Boyce et al.

(10) Patent No.: US 10,233,532 B2
(45) Date of Patent: Mar. 19, 2019

(54) COATED ARTICLE WITH LOW-E COATING HAVING REFLECTING SYSTEM WITH SILVER AND ZINC BASED BARRIER LAYER(S)

(71) Applicant: GUARDIAN GLASS, LLC, Auburn Hills, MI (US)

(72) Inventors: Brent Boyce, Novi, MI (US); Yiwei Lu, Ann Arbor, MI (US); Guowen Ding, San Jose, CA (US); Guizhen Zhang, San Jose, CA (US); Daniel Lee, San Jose, CA (US); Daniel Schweigert, San Jose, CA (US); Cesar Clavero, San Jose, CA (US); Scott Jewhurst, San Jose, CA (US); Minh Le, San Jose, CA (US)

(73) Assignee: Guardian Glass, LLC, Auburn Hills, MI (US)

( * ) Notice: Subject to any disclaimer, the term of this patent is extended or adjusted under 35 U.S.C. 154(b) by 197 days.

(21) Appl. No.: 15/446,023

(22) Filed: Mar. 1, 2017

(65) Prior Publication Data
US 2018/0251888 A1    Sep. 6, 2018

(51) Int. Cl.
| | | |
|---|---|---|
| *B32B 15/04* | (2006.01) | |
| *B32B 17/06* | (2006.01) | |
| *C23C 14/18* | (2006.01) | |
| *C23C 14/06* | (2006.01) | |
| *C23C 14/34* | (2006.01) | |
| *C03C 17/36* | (2006.01) | |

(52) U.S. Cl.
CPC ............ *C23C 14/185* (2013.01); *C03C 17/36* (2013.01); *C03C 17/366* (2013.01); *C03C 17/3639* (2013.01); *C03C 17/3644* (2013.01); *C03C 17/3647* (2013.01); *C23C 14/0652* (2013.01); *C23C 14/3464* (2013.01)

(58) Field of Classification Search
USPC .................. 428/426, 428, 432, 434, 688
See application file for complete search history.

(56) References Cited

U.S. PATENT DOCUMENTS

| | | | |
|---|---|---|---|
| 4,883,721 A | 11/1989 | Nalepka et al. | |
| 5,344,718 A | 9/1994 | Hartig et al. | |
| 6,432,545 B1 * | 8/2002 | Schicht | C03C 17/36 |
| | | | 428/432 |

(Continued)

FOREIGN PATENT DOCUMENTS

| | | |
|---|---|---|
| DE | 196 07 611 | 10/1997 |
| EP | 0 233 003 | 8/1987 |

OTHER PUBLICATIONS

ISA International Search Report dated Jun. 13, 2018 for PCT/US2018/020111.

*Primary Examiner* — Lauren R Colgan
(74) *Attorney, Agent, or Firm* — Nixon & Vanderhye P.C.

(57) ABSTRACT

A coated article includes a silver (Ag) based infrared (IR) reflecting layer(s) on a glass substrate that is provided adjacent to and contacting at least one metallic or substantially metallic zinc (Zn) inclusive barrier layer in order to improve chemical durability characteristics of the low-E coating. In certain example embodiments, the silver based layer may be sandwiched between first and second metallic or substantially metallic barrier layers of or including zinc. The IR reflecting layer(s) and zinc based barrier layer(s) are part of a low emissivity (low-E) coating.

37 Claims, 2 Drawing Sheets

(56) References Cited

U.S. PATENT DOCUMENTS

| | | |
|---|---|---|
| 6,576,349 B2 | 6/2003 | Lingle et al. |
| 6,602,608 B2 | 8/2003 | Stachowiak |
| 6,610,410 B2 | 8/2003 | Ebisawa et al. |
| 7,153,579 B2 | 12/2006 | Kriltz et al. |
| 7,241,506 B2 | 7/2007 | Hartig |
| 7,390,572 B2 | 6/2008 | Butz et al. |
| 8,679,633 B2 * | 3/2014 | Imran .................... C03C 17/36 428/432 |
| 8,945,714 B2 | 2/2015 | Lao et al. |
| 9,028,956 B2 | 5/2015 | Knoll et al. |
| 9,028,983 B2 | 5/2015 | Imran et al. |
| 9,052,456 B2 | 6/2015 | Hassan et al. |
| 9,212,417 B2 | 12/2015 | Frank et al. |
| 9,297,197 B2 | 3/2016 | Lao et al. |
| 9,315,414 B2 | 4/2016 | Hassan et al. |
| 9,365,450 B2 | 6/2016 | Ding et al. |
| 9,371,684 B2 | 6/2016 | Butz et al. |
| 9,403,345 B2 | 8/2016 | Lao et al. |
| 9,410,359 B2 | 8/2016 | Ding et al. |
| 9,518,319 B2 | 12/2016 | Ding et al. |
| 9,556,070 B2 | 1/2017 | Wuillaume et al. |
| 2010/0062245 A1 * | 3/2010 | Martin .............. B32B 17/10174 428/336 |
| 2014/0356634 A1 | 12/2014 | Lao et al. |
| 2016/0122235 A1 * | 5/2016 | Zhang .................... C03C 17/36 428/622 |
| 2016/0122238 A1 * | 5/2016 | Roquiny ............ C03C 17/3618 428/336 |

* cited by examiner

COATED ARTICLE WITH LOW-E COATING HAVING REFLECTING SYSTEM WITH SILVER AND ZINC BASED BARRIER LAYER(S)

This application relates to a coated article including a silver (Ag) based infrared (IR) reflecting layer(s) that is provided adjacent to and contacting at least one metallic or substantially metallic zinc (Zn) based barrier layer in order to improve chemical durability characteristics of the low-E coating. In certain example embodiments, the silver based layer may be sandwiched between first and second metallic or substantially metallic barrier layers of or including zinc (Zn). The IR reflecting layer(s) and zinc based barrier layer(s) are part of a low emissivity (low-E) coating, and may be sandwiched between at least transparent dielectric layers. Such low-E coating may be used in applications such as monolithic windows, insulated glass (IG) window units, and the like.

BACKGROUND AND SUMMARY OF EXAMPLE EMBODIMENTS OF THE INVENTION

Coated articles are known in the art for use in window applications such as insulating glass (IG) window units, vehicle windows, monolithic windows, and/or the like. In certain example instances, designers of coated articles often strive for a combination of high visible transmission, substantially neutral color, low emissivity (or emittance), low sheet resistance ($R_s$), low U-values in the context of IG window units, and/or low specific resistivity. High visible transmission and substantially neutral color may permit coated articles to be used in applications where these characteristics are desired such as in architectural or vehicle window applications, whereas low-emissivity (low-E), low sheet resistance, and low specific resistivity characteristics permit such coated articles to block significant amounts of IR radiation so as to reduce for example undesirable heating of vehicle or building interiors.

Low-E coatings having at least one silver based IR reflecting layer are known in the art. For example, see U.S. Pat. Nos. 5,344,718, 6,576,349, 8,945,714, 9,371,684, 9,028,956, 9,556,070, 8,945,714, 9,028,983, which are all hereby incorporated herein by reference. Low-E coatings on glass are widely used in commercial and residential buildings to save energy. The double Ag low-E coating is a dominant low-E product due to its excellent low emissivity properties and excellent control of solar heat gain.

However, conventional low-E coatings with silver IR reflecting layer(s) have problems associated with chemical durability and/or environmental durability which limit their applications. A reason is that the silver IR reflecting layers are not very stable, especially for double silver type low-E coatings. Once the Ag is decayed or damaged, the silver's optical, electrical, and thermal (emissivity) properties are degraded. For example, a solar control low-E coating with stack of glass/Si3N4/NiCr/Ag/NiCr/Si3N4 provides efficient solar control, but cannot reasonably survive chemical environments such as HCl acid environmental conditions. While there are some durable low-E coatings in the market, their performances are poor especially with respect to undesirably low light-to-solar gain ratio (LSG) values of around 1.0 or less. The higher the LSG value, the more energy saved. LSG is calculated as $T_{vis}$/SHGC, where SHGC is according to NRFC 2001.

Example embodiments of this invention solve these problems by providing a low-E coating that has improved silver durability (e.g., chemical durability), while maintaining high LSG values. Example embodiments of this invention relate to a coated article including a silver (Ag) based infrared (IR) reflecting layer(s) that is provided adjacent to and contacting at least one metallic or substantially metallic zinc (Zn) based barrier layer in order to improve chemical durability characteristics of the low-E coating. In certain example embodiments, the silver based layer may be sandwiched between first and second metallic or substantially metallic barrier layers of or including zinc (Zn). The IR reflecting layer(s) and zinc based barrier layer(s) are part of a low emissivity (low-E) coating, and may be sandwiched between at least transparent dielectric layers. It has surprisingly been found that providing a silver based IR reflecting layer directly between and adjacent first and second metallic or substantially metallic barrier layers of or including zinc provides for improved corrosion resistance and chemical durability of the silver based IR reflecting layer(s) and the overall coating, while maintaining good optical and emissivity properties such as high LSG values of at least 1.10 (more preferably at least 1.20, and sometimes at least 1.30).

In an example embodiment of this invention, there is provided a method of making a coated article including a coating supported by a glass substrate, the method comprising: depositing a first dielectric layer on the glass substrate; depositing an infrared (IR) reflecting layer comprising silver on the glass substrate located over at least the first dielectric layer; depositing a barrier layer comprising zinc that is metallic or substantially metallic on the glass substrate over and directly contacting the IR reflecting layer comprising silver; depositing a second dielectric layer on the glass substrate located over at least the IR reflecting layer and the barrier layer comprising zinc; and wherein the coating has a sheet resistance ($R_s$) of no greater than 11 ohms/square and a normal emissivity ($E_n$) of no greater than 0.2.

In an example embodiment of this invention, there is provided a coated article including a coating supported by a glass substrate, the coating comprising: a first dielectric layer on the glass substrate; a first barrier layer comprising zinc that is metallic or substantially metallic on the glass substrate over at least the first dielectric layer; an infrared (IR) reflecting layer comprising silver on the glass substrate located over and directly contacting the first barrier layer comprising zinc; a second barrier layer comprising zinc that is metallic or substantially metallic on the glass substrate over and directly contacting the IR reflecting layer comprising silver, so that the IR reflecting layer comprising silver is located between and directly contacting the first and second barrier layers comprising zinc; a second dielectric layer on the glass substrate located over at least the first and second barrier layers and the IR reflecting layer; and wherein the coating has a sheet resistance ($R_s$) of no greater than 11 ohms/square (more preferably no greater than 10 ohms/square, and most preferably no greater than 9 ohms/square) and a normal emissivity ($E_n$) of no greater than 0.2 (more preferably no greater than 0.15, and most preferably no greater than 0.11).

DETAILED DESCRIPTION OF EXAMPLE EMBODIMENTS OF THE INVENTION

Referring now to the drawings in which like reference numerals indicate like parts throughout the several views.

Figure 1:
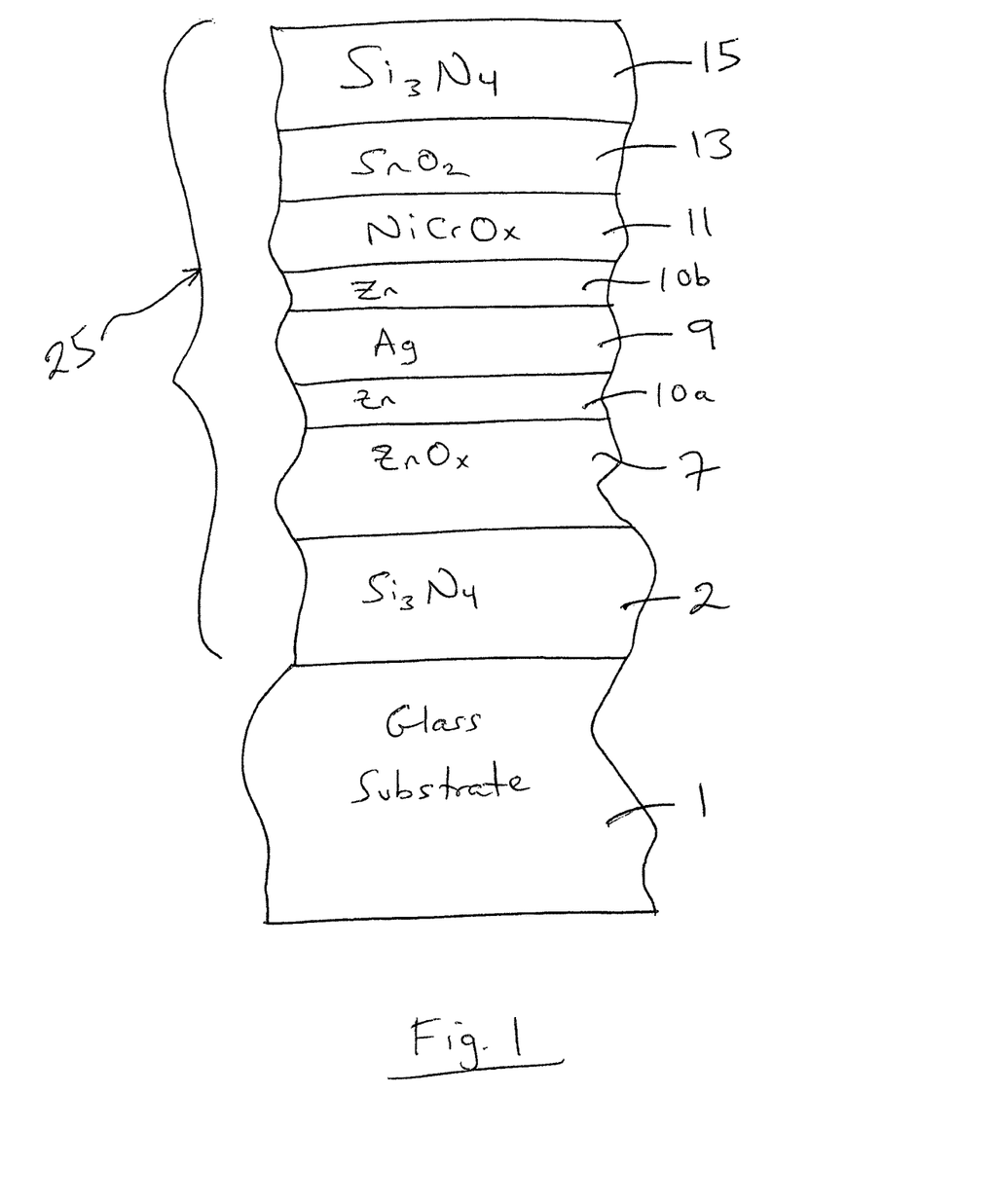
FIG. 1 is a cross sectional view of a coated article according to an example embodiment of this invention.
Figure 2:
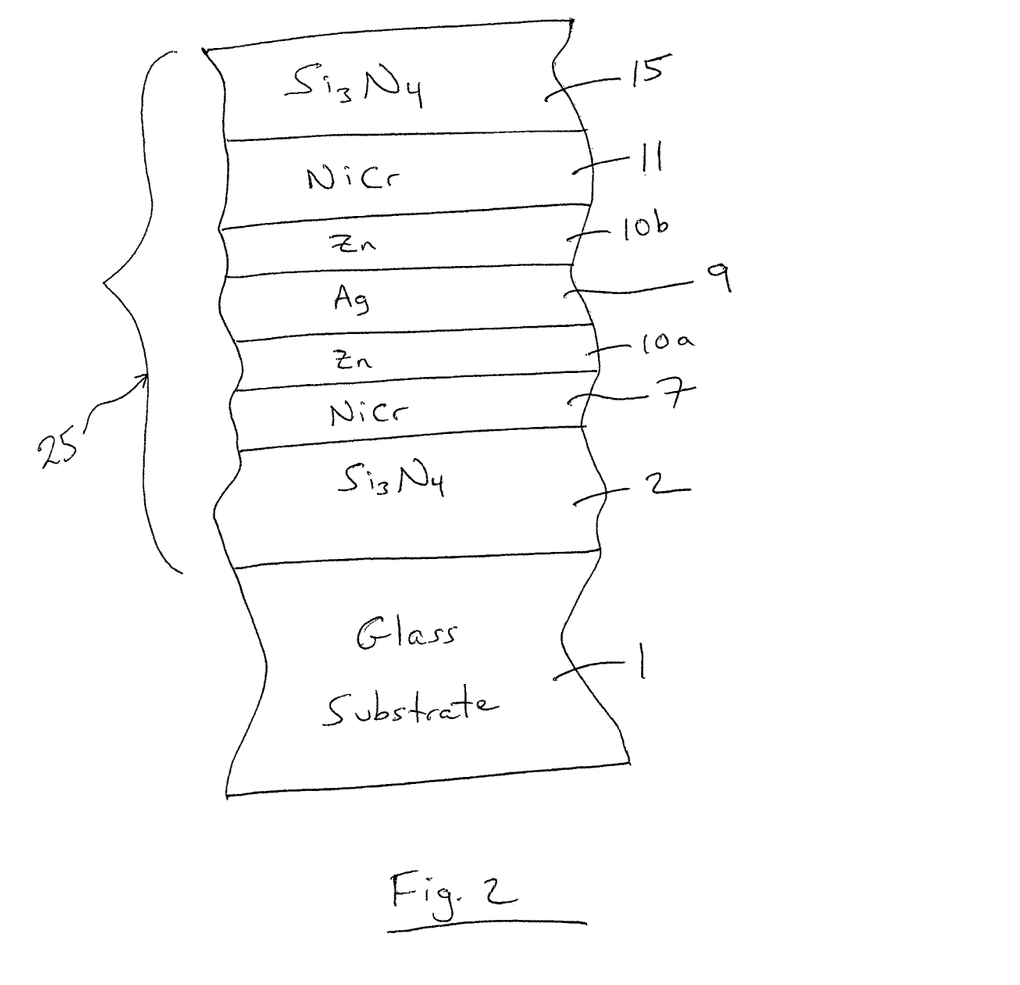
FIG. 2 is a cross sectional view of a coated article according to another example embodiment of this invention.

Example embodiments of this invention relate to a coated article including a glass substrate 1 that supports a low-E coating. The low-E coating is designed to have improved silver durability (e.g., chemical durability), while maintaining high LSG values. Example embodiments of this invention relate to a coated article including at least one silver (Ag) based infrared (IR) reflecting layer(s) 9 that is provided adjacent to and contacting at least one metallic or substantially metallic zinc (Zn) based barrier layer 10a and/or 10b in order to improve chemical durability characteristics of the low-E coating. In certain example embodiments, the silver based IR reflecting layer 9 may be sandwiched between first and second metallic or substantially metallic barrier layers of or including zinc (Zn) 10a and 10b. The IR reflecting layer(s) 9 and zinc based barrier layer(s) 10a, 10b are part of a low emissivity (low-E) coating, and may be sandwiched between at least transparent dielectric layers such as layers 2, 13 and/or 15. It has surprisingly been found that providing a silver based IR reflecting 9 layer directly between and adjacent first and second metallic or substantially metallic barrier layers of or including zinc 10a and 10b provides for improved corrosion resistance and chemical durability of the silver based IR reflecting layer(s) 9 and the overall low-E coating, while maintaining good optical and emissivity properties such as high LSG values of at least 1.10 (more preferably at least 1.20, and sometimes at least 1.30). These LSG values are measured monolithically. Such coated articles may be used in applications such as monolithic windows, insulated glass (IG) window units, and the like.

FIG. 1 is a cross sectional view of a coated article according to an example embodiment of this invention. The coated article includes glass substrate 1 (e.g., clear, green, bronze, or blue-green glass substrate from about 1.0 to 10.0 mm thick, more preferably from about 1.0 mm to 6.0 mm thick), and a multi-layer low-E coating (or layer system) 25 provided on the substrate 1 either directly or indirectly. As shown in FIG. 1, the low-E coating 25 is of or includes transparent dielectric layer 2 of or including silicon nitride (e.g., $Si_3N_4$, or some other suitable stoichiometry), zinc oxide inclusive transparent dielectric layer 7 (e.g., $ZnO_x$ where "x" may be about 1; or $ZnAlO_x$), metallic or substantially metallic IR (infrared) reflecting layer 9 of or including silver, zinc based barrier layers 10a and 10b provided directly on and contacting the silver based IR reflecting layer 9 on both sides thereof, barrier layer 11 of or including an oxide and/or nitride of Ni and/or Cr (e.g., $NiCrO_x$), and an overcoat of or including tin oxide inclusive transparent dielectric layer 13 and silicon nitride inclusive transparent dielectric layer 15. The silicon nitride inclusive layers 2 and/or 15 may further include Al, oxygen, or the like, and the tin oxide layer 13 may likewise further include other materials such as nitrogen, zinc, or the like. Other layers and/or materials may also be provided in the coating in certain example embodiments of this invention, and it is also possible that certain layers may be removed or split in certain example instances. For example, a zirconium oxide overcoat layer (not shown) may be provided over layer 15 in certain example embodiments of this invention. As another example, layer 10a or layer 10b may be omitted in certain example embodiments of this invention. Moreover, one or more of the layers discussed above may be doped with other materials in certain example embodiments of this invention.

FIG. 2 is a cross sectional view of a coated article according to another example embodiment of this invention. FIG. 2 is the same as FIG. 1, except that in the FIG. 2 embodiment layers 7 and 11 are of NiCr and/or $NiCrO_x$ and layer 13 from FIG. 1 is omitted. In both the FIG. 1 and FIG. 2 embodiments, the low-E coating 25 includes at least one silver based IR reflecting layer(s) 9 provided adjacent to and contacting at least one metallic or substantially metallic zinc based barrier layer 10a and/or 10b in order to improve chemical durability of the low-E coating.

Conventional silver based low-E coatings have chemical durability issues as explained above, such as in the HCl and CASS solvents. A mechanism for corrosion is galvanic corrosion: Bimetallic corrosion occurs when two metals, with different potentials, are in electrical contact while in an electrically conducting corrosive liquid. The effect of two metals together increases the corrosion rate of the anode and reduces or even suppresses corrosion of the cathode. Thus the anode materials will be corroded much faster, and corrosion of the cathode is suppressed. In example embodiments of this invention, silver IR reflecting layer 9 is at the cathode position, so that the cathode silver 9 will be protected by the anode materials 10a, 10b. Metallic or substantially metallic zinc 10a, 10b is provided as the direct neighbor of silver 9 to protect silver from chemical corrosion in low-E stacks according to example embodiments of this invention.

Note that "substantially" metallic means metallic with no more than 10% oxygen content, more preferably no more than 5% oxygen content, atomic %. Substantially metallic Zn based layers 10a and 10b may contain from 0-10% oxygen and/or nitrogen, more preferably from 0-5% oxygen and/or nitrogen (atomic %), in example embodiments of this invention.

In monolithic instances, the coated article includes only one substrate such as glass substrate 1 (see FIGS. 1-2). However, monolithic coated articles herein may be used in devices such as IG window units for example which include multiple glass substrates. Example IG window units are illustrated and described, for example, in U.S. Pat. Nos. 5,770,321, 5,800,933, 6,524,714, 6,541,084 and US 2003/0150711, the disclosures of which are all hereby incorporated herein by reference. An example IG window unit may include, for example, the coated glass substrate 1 shown in FIGS. 1-2 coupled to another glass substrate via spacer(s), sealant(s) or the like with a gap being defined therebetween. This gap between the substrates in IG unit embodiments may in certain instances be filled with a gas such as argon (Ar). An example IG unit may comprise a pair of spaced apart substantially clear glass substrates each about 3-4 mm thick one of which is coated with a coating herein in certain example instances, where the gap between the substrates may be from about 5 to 30 mm, more preferably from about 10 to 20 mm, and most preferably about 12-16 mm. In certain example instances, the coating may be provided on the side of the inner or outer glass substrate 1 facing the gap.

Referring to FIGS. 1-2, silicon nitride inclusive transparent dielectric layer 2 is provided for antireflection purposes, and have been found to allow color shifts to be reduced. Silicon nitride layer 2 may be of or include $Si_3N_4$. Alternatively, the silicon nitride layer 2 may be of the Si-rich type (not fully stoichiometric). Moreover, one or both of the silicon nitride layers 2 and/or 15 may further include a dopant such as aluminum or stainless steel, and/or small amounts of oxygen. These layers may be deposited via sputtering in certain example embodiments, or via any other suitable technique. It is possible that other materials such as titanium oxide, zinc stannate, or tin oxide may be used for transparent dielectric layer(s) 2 and/or 15.

Transparent dielectric seed layer 7 is of or includes zinc oxide (e.g., ZnO) in the FIG. 1 embodiment. The zinc oxide of layer(s) 7 may contain other materials as well such as Al (e.g., to form $ZnAlO_x$) in certain example embodiments. For example, in certain example embodiments of this invention, zinc oxide layer 7 may be doped with from about 1 to 10% Al (or B), more preferably from about 1 to 5% Al (or B), and most preferably about 2 to 4% Al (or B). The use of zinc oxide 7 under the silver in layer 9 allows for an excellent quality of silver to be achieved. In certain example embodiments (e.g., to be discussed below) the zinc oxide inclusive layer 7 may be formed via sputtering a ceramic ZnO or metal rotatable magnetron sputtering target. It has been found that the use of the ceramic target in certain example embodiments (e.g., of ZnO, which may or may not be doped with Al, F or the like) allows for a high quality of silver to be provided thereby resulting in a lower emissivity coating. While the Zn:O in the ceramic target may be stoichiometric in certain example embodiments, at least one substoichiometric ceramic target comprising $ZnO_x$ (e.g., where $0.25 \leq x \leq 0.99$, more preferably $0.50 \leq x \leq 0.97$, and even more preferably $0.70 \leq x \leq 0.96$) may instead be used in sputter-depositing a zinc oxide inclusive layer 7 which may be substoichiometric in certain instances. It is possible that other materials such as zinc stannate, NiCr, $NiCrN_x$, $NiCrMoN_x$ or $NiCrO_x$ may be used for layer 7 in alternative embodiments of this invention. While seed layer 7 is of or includes zinc oxide in the FIG. 1 embodiment, this layer may be of or include other materials such as zinc stannate, NiCr, or $NiCrO_x$, with FIG. 2 showing an example embodiment where layer 7 is of or includes NiCr and/or $NiCrO_x$.

Transparent infrared (IR) reflecting layer 9 is preferably conductive and metallic or substantially metallic, and preferably comprises or consists essentially of silver (Ag). IR reflecting layer 9 helps allow the coating to have low-E and/or good solar control characteristics such as low emittance, low sheet resistance, and so forth. In certain example embodiments, silver (Ag) IR reflecting layer 9 is located between and directly contacting metallic or substantially metallic zinc (Zn) based layers 10a and 10b, as shown in FIGS. 1-2. Barrier layers 10a and 10b may be deposited entirely of zinc in certain example embodiments of this invention, or may optionally be of zinc doped with from 1-20% Al, more preferably doped with from 1-10% Al. Thus, layers 10a and 10b may be of Zn in certain example embodiments of this invention, or may be of ZnAl, ZnAg, or ZnAlAg in other example embodiments of this invention. Zinc based barrier layers 10a and/or 10b, as deposited such as via sputter-deposition, are preferably metallic or substantially metallic with no more than 10% oxygen content, more preferably no more than 5% oxygen content, atomic %. If an oxide layer such as $NiCrO_x$ 11 is sputter-deposited over barrier layer 10b, then it is possible that barrier layer 10b may become oxided to some extent during the deposition of layer 11 thereover. However, if layer 11 is not an oxide layer, and instead is a nitride layer, then its deposition should not cause any significant oxiding of barrier layer 10b. As explained herein, it has surprisingly been found that providing a silver based IR reflecting 9 layer directly between and adjacent first and second metallic or substantially metallic barrier layers of or including zinc 10a and 10b provides for improved corrosion resistance and chemical durability of the silver based IR reflecting layer(s) 9 and the overall low-E coating, while maintaining good optical and emissivity properties such as high LSG values. One or both of the barrier layers may be formed of ZnAg, such as zinc doped with from 1-15% Ag, in certain example embodiments of this invention. Moreover, layer 10a may be omitted in certain example embodiments of this invention.

Still referring to FIGS. 1-2, secondary barrier layer 11 may be of or include an oxide of Ni and/or Cr, or may be metallic and of or include Ni and/or Cr and may be nitride for example. In certain example embodiments, barrier layers 7 and/or 11 may each be of or include NiCr, $NiCrN_x$, NiCrMo, $NiCrMoO_x$, $NiCrMoN_x$, $NiTiNbO_x$, nickel (Ni) oxide, chromium/chrome (Cr) oxide, $TiO_x$, or a nickel alloy oxide such as nickel chrome oxide ($NiCrO_x$), or other suitable material. Layers 7 and 11 may contain about 0-20% nitrogen, more preferably from about 1-10% nitrogen, in certain example embodiments of this invention. Layer 11 (e.g., of or including an oxide of Ni and/or Cr) may or may not be oxidation graded in different embodiments of this invention. Oxidation grading means that the degree of oxidation in the layer changes through the thickness of the layer so that for example a contact layer may be graded so as to be less oxidized at the contact interface with the immediately adjacent Zn based layer than at a portion of the contact layer further or more/most distant from the IR reflecting layer.

The overcoat is of or includes transparent dielectric layers 13 and/or 15 in certain example embodiments. See FIGS. 1-2. Dielectric layer 13 may be of or include a metal oxide such as tin oxide in certain example embodiments of this invention. Metal oxide inclusive layer 13, such as tin oxide or zinc stannate, is provided for antireflection purposes, and also improves the emissivity of the coated article and the stability and efficiency of the manufacturing process. The tin oxide inclusive layer 13 may be doped with other materials such as nitrogen and/or zinc in certain example embodiments of this invention. The tin oxide based layer 13 provides good durability and improves light transmission. Dielectric layer 15 may be of or include silicon nitride (e.g., $Si_3N_4$ or other suitable stoichiometry) or any other suitable material in certain example embodiments of this invention such as silicon oxynitride. Silicon nitride layer 15 may further include other material, such as aluminum as a dopant or small amounts of oxygen in certain example embodiments of this invention. Optionally, other layers such as a zirconium oxide overcoat may be provided above layer 15 in the overcoat in certain example instances. Layer 15 is provided for durability purposes, and to protect the underlying layers. In certain example embodiments, silicon nitride based layer 15 may have an index of refraction (n) of from about 1.9 to 2.2, more preferably from about 1.95 to 2.05. In certain example embodiments, Zr may be provided in the silicon nitride of layer 15 (or layer 2 or layer 5). Thus, one or more of layers 2 and/or 15 may be of or include SiZrNx and/or zirconium oxide in certain example embodiments of this invention.

Other layer(s) below or above the illustrated coating may also be provided. Thus, while the layer system or coating is "on" or "supported by" substrate 1 (directly or indirectly), other layer(s) may be provided therebetween. Thus, for example, the coating of FIG. 1 may be considered "on" and "supported by" the substrate 1 even if other layer(s) are provided between layer 3 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention.

While various thicknesses may be used in different embodiments of this invention, example thicknesses and materials for the respective layers on the glass substrate 1 in the FIG. 1 embodiment are as follows, from the glass substrate outwardly (e.g., the Al content in the zinc oxide layer and the silicon nitride layers may be from about 1-10%, more preferably from about 1-3% in certain example instances):

TABLE 1

(Example Materials/Thicknesses; FIG. 1 Embodiment)

| Layer | Preferred Range (Å) | More Preferred (Å) | Example (Å) |
|---|---|---|---|
| $Si_xN_y$ (layer 2) | 20-300 Å | 60-160 Å | 135 Å |
| $ZnAlO_x$ (layer 7) | 10-200 Å | 40-120 Å | 90 Å |
| Zn (layer 10a) | 10-100 Å | 15-40 Å | 17-33 Å |
| Ag (layer 9) | 40-150 Å | 60-140 Å | 125 Å |
| Zn (layer 10b) | 10-100 Å | 15-40 Å | 17-33 Å |
| $NiCrO_x$ (layer 11) | 10-70 Å | 20-50 Å | 30 Å |
| $SnO_2$ (layer 13) | 50-300 Å | 160-180 Å | 170 Å |
| $Si_xN_y$ (layer 15) | 100-800 Å | 300-600 Å | 500 Å |

While various thicknesses may be used in different embodiments of this invention, example thicknesses and materials for the respective layers on the glass substrate 1 in the FIG. 2 embodiment are as follows, from the glass substrate outwardly (e.g., the Al content in the zinc oxide layer and the silicon nitride layers may be from about 1-10%, more preferably from about 1-3% in certain example instances):

TABLE 2

(Example Materials/Thicknesses; FIG. 2 Embodiment)

| Layer | Preferred Range (Å) | More Preferred (Å) | Example (Å) |
|---|---|---|---|
| $Si_xN_y$ (layer 2) | 20-300 Å | 60-160 Å | 272 Å |
| NiCr (layer 7) | 5-100 Å | 5-40 Å | 10 Å |
| Zn (layer 10a) | 10-100 Å | 15-40 Å | 17-33 Å |
| Ag (layer 9) | 40-150 Å | 60-140 Å | 125 Å |
| Zn (layer 10b) | 10-100 Å | 15-40 Å | 17-33 Å |
| NiCr (layer 11) | 5-100 Å | 5-40 Å | 10 Å |
| $Si_xN_y$ (layer 15) | 100-800 Å | 300-600 Å | 510 Å |

It has been surprisingly and unexpectedly be found that providing the first and second barrier layer 10a and 10b each at a physical thickness of from 15-40 Å thick, more preferably from 17-33 Å thick, advantageously results in improved thermal stability upon optional heat treatment such as thermal tempering. It has been found that thicknesses of layers 10a, 10b over 40 angstroms resulted in less thermal stability, indicating too much color shift and/or coating damage by the heat treatment, and thicknesses less than 15 angstroms may result in insufficient chemical durability. Thus, these thickness ranges have been found to be particularly advantageous.

It has also been surprisingly found that the presence of layers 7 and 11 is particularly important to durability. Examples 1-3 below demonstrate that the presence of NiCr layers 7 and 11, in combination with the Zn layers, unexpectedly improved chemical durability of the low-E coating in a surprising manner. When the NiCr layers were not present (see Example 3 below), delamination occurred upon chemical testing.

In certain example embodiments of this invention, coated articles herein (e.g., see FIGS. 1-2) may have the following low-E (low emissivity), solar and/or optical characteristics set forth in Table 3 when measured monolithically, before and/or after any optional heat treatment such as thermal tempering.

TABLE 3

Low-E/Solar Characteristics (Monolithic; FIG. 1-2 Embodiments)

| Characteristic | General | More Preferred | Most Preferred |
|---|---|---|---|
| $R_s$ (ohms/sq.): | <=11.0 | <=10 | <=9 |
| $E_n$: | <=0.2 | <=0.15 | <=0.11 |
| $T_{vis}$ (%): | >=40 | >=50 | >=60 |
| LSG: | >=1.10 | >=1.20 | >=1.30 |

While the combination of IR reflecting layer 9 and Zn based barrier layers 10a, 10b is used in the coatings of FIGS. 1 and 2 in certain example embodiments of this invention discussed herein, it is possible to use one or more of the combination of IR reflecting layer 9 and Zn based barrier layers 10a, 10b in other low-E coatings. For example and without limitation, each of the silver based IR reflecting layer(s) in the low-E coatings in any of U.S. Pat. Nos. 5,344,718, 6,576,349, 8,945,714, 9,371,684, 9,028,956, 9,556,070, 8,945,714, and/or 9,028,983 (which are all hereby incorporated herein by reference) may be replaced with the combination of IR reflecting layer 9 and Zn based barrier layers 10a, 10b discussed herein in example embodiments of this invention. In other words, for example, the silver based IR reflecting layer(s) in any of U.S. Pat. Nos. 5,344,718, 6,576,349, 8,945,714, 9,371,684, 9,028,956, 9,556,070, 8,945,714, and/or 9,028,983 may be replaced with a silver based IR reflecting layer 9 and Zn based barrier layers 10a, 10b as discussed herein.

Three Example coated articles, Examples 1-3, according to embodiments of this invention, and a comparative example (CE), were made and tested, each having the same low-E coating, except that in the CE the Zn layers 10a and 10b were not present. Thus, in the three Examples according to an example of this invention the silver IR reflecting layer 9 was located between and contacting Zn layers 10a and 10b, whereas in the CE the layers 10a and 10b were not present. The comparative example (CE) had a low-E coating of glass/$Si_3N_4$/NiCr/Ag/NiCr/$Si_3N_4$. Meanwhile, the first and second Examples according to embodiments of this invention had the following stack: glass/$Si_3N_4$/NiCr/Zn/Ag/Zn/NiCr/$Si_3N_4$. Example 1 had a layer stack of glass/$Si_3N_4$ (272 Å)/NiCr(10 Å)/Zn(20 Å)/Ag(125 Å)/Zn(20 Å)/NiCr (10 Å)/$Si_3N_4$(510 Å). And Example 3 had a layer stack of glass/$Si_3N_4$ (272 Å)/Zn(30 Å)/Ag(125 Å)/Zn(20 Å)/$Si_3N_4$ (510 Å). Thus, in Example 3 the NiCr layers 7 and 11 were omitted. The data from Examples 1 and 2 according to embodiments of this invention is set forth below. Note that in the chart below "normal" stands for normal emmisivity/emittance ($E_n$).

| Data for Example 1 | | | |
|---|---|---|---|
| | | | DH-06-00 AC |
| Monolithic Optics | T | Y (%) | 60.1 |
| | | a* | −2.13 |

-continued

Data for Example 1

|  |  |  | DH-06-00 AC |
|---|---|---|---|
| (Ill 'C', | | b* | 3.5 |
| 2 deg.) | Rg | Y (%) | 21.3 |
|  |  | a* | −3.92 |
|  |  | b* | −4.7 |
|  | Rf | Y (%) | 7 |
|  |  | a* | 4.1 |
|  |  | b* | −25.7 |
|  | A[vis] (100-TT-Rf) | | 32.9 |
|  | A[vis] (100-TT-Rg) | | 18.6 |
| Normal Emissivity (EN) | | | 0.084 |
| Haze (%) | | | 0.07 |
| NFRC 2001 monolithic surface 2 | Tvis (%) | | 60.1 |
| | Tsol (%) | | 42.0 |
| | Rsol (%) | | 28.0 |
| | Asol (%) | | 30.0 |
| | Uval | | 0.615 |
| | SHGC | | 46.5 |
| | LSG | | 1.29 |

Data for Example 2

|  |  |  | Monolithic |
|---|---|---|---|
| Monolithic Optics (Ill 'C', 2 deg. | T | Y (%) | 47.68 |
|  |  | a* | −1.6 |
|  |  | b* | −2.48 |
|  | Rg | Y (%) | 13 |
|  |  | a* | −0.27 |
|  |  | b* | −0.95 |
|  | Rf | Y (%) | 33.5 |
|  |  | a* | −0.6 |
|  |  | b* | 3.77 |
|  | A[vis] (100-TT-Rg) | | 39.32 |
| NFRC 2001 monolithic surface 2 | Tvis (%) | | 47.7 |
| | Tsol (%) | | 35.4 |
| | Rsol (%) | | 23.2 |
| | Asol (%) | | 41.4 |
| | Uval | | 0.615 |
| | SHGC | | 41.8 |
| | LSG | | 1.14 |

Chemical testing was performed on Examples 1-2, and the Comparative Example (CE), in order to test their respective chemical durability characteristics. All three samples were dipped in solvents of HCl (80%) and CASS at 65 degrees C. for one hour. The results were surprising.

However, in chemical tests it was surprisingly found that doping the silver IR reflecting layer with Si and Al improved chemical durability. While slight etching could be seen at the very outer edge of Examples 1-2 after these dips in solvents, the solvent dips caused many more defects in the CE sample. In other words, Examples 1-2 were virtually defect free, whereas the CE has a significant number of defects after the solvent dips. Thus, it has surprisingly been found that providing the silver based IR reflecting layer 9 between and directly contacting Zn layers 10a and 10b significantly improves chemical durability of a low-E coating.

It has also been surprisingly and unexpectedly be found that providing the first and second barrier layer 10a and 10b each at a physical thickness of from 15-40 Å thick, more preferably from 15-40 Å thick, advantageously results in improved thermal stability upon optional heat treatment such as thermal tempering. Examples 1-2 were heat treated for about 12 minutes at about 650 degrees C., and it was found that thicknesses of layers 10a, 10b over 40 angstroms resulted in less thermal stability, indicating too much color shift and/or coating damage by the heat treatment, and thicknesses less than 15 angstroms may result in insufficient chemical durability. Thus, these thickness ranges have been found to be advantageous.

It has also been surprisingly found that the presence of layers 7 and 11 is particularly important to durability. As explained above, Examples 1-2 had NiCr barrier layers 7 and 11 which were slightly nitrided included about 5% nitrogen, whereas in Example 3 the NiCr layers 7 and 11 were omitted. Example 3 delaminated when subjected to the HCl and CASS soak/dip tests described above, whereas Examples 1-2 demonstrated excellent durability when subjected to these same tests. Thus, the presence of NiCr or NiCrN$_x$ barrier layers 7 and 11, in combination with the Zn layers, unexpected improved chemical durability of the low-E coating in a surprising manner.

In an example embodiment of this invention, there is provided a coated article including a coating supported by a glass substrate, the coating comprising: a first dielectric layer on the glass substrate; a first barrier layer comprising zinc that is metallic or substantially metallic on the glass substrate over at least the first dielectric layer; an infrared (IR) reflecting layer comprising silver on the glass substrate located over and directly contacting the first barrier layer comprising zinc; a second barrier layer comprising zinc that is metallic or substantially metallic on the glass substrate over and directly contacting the IR reflecting layer comprising silver, so that the IR reflecting layer comprising silver is located between and directly contacting the first and second barrier layers comprising zinc; a second dielectric layer on the glass substrate located over at least the first and second barrier layers and the IR reflecting layer; and wherein the coating has a sheet resistance ($R_s$) of no greater than 11 ohms/square (more preferably no greater than 10 ohms/square, and most preferably no greater than 9 ohms/square) and a normal emissivity ($E_n$) of no greater than 0.2 (more preferably no greater than 0.15, and most preferably no greater than 0.11).

In the coated article of the immediately preceding paragraph, the IR reflecting layer may consist of, or consist essentially of, silver.

In the coated article of any of the preceding two paragraphs, the IR reflecting layer may be metallic or substantially metallic.

In the coated article of any of the preceding three paragraphs, the coated article may have a visible transmission of at least 40%, more preferably at least 50%.

In the coated article of any of the preceding four paragraphs, the coated article may have a light-to-solar gain ratio (LSG) of at least 1.10, more preferably at least 1.20, and most preferably at least 1.30.

In the coated article of any of the preceding five paragraphs, the first and/or second dielectric layer may comprise silicon nitride.

In the coated article of any of the preceding six paragraphs, the first and/or second barrier layer comprising zinc may further comprises aluminum.

In the coated article of any of the preceding seven paragraphs, the coating may further comprise a second infrared (IR) reflecting layer comprising silver that is located between third and fourth metallic or substantially metallic barrier layers of or including zinc or zinc aluminum.

In the coated article of any of the preceding eight paragraphs, the first and/or second barrier layer(s) comprising zinc may each be from 15-40 Å thick, more preferably from 17-33 Å thick.

In the coated article of any of the preceding nine paragraphs, the coating may further comprise a dielectric layer comprising zinc oxide, or a layer comprising Ni and/or Cr, located under and directly contacting the first barrier layer comprising zinc.

In the coated article of any of the preceding ten paragraphs, the coating may further comprise a layer comprising Ni and/or Cr located over and directly contacting the second barrier layer comprising zinc.

In the coated article of any of the preceding eleven paragraphs, metal content of the first and/or second barrier layers may be at least 90% zinc.

In the coated article of any of the preceding twelve paragraphs, the coating may further including an overcoat of or including zirconium oxide located over the second dielectric layer.

In the coated article of any of the preceding thirteen paragraphs, the coating may further comprise a first layer comprising Ni and/or Cr located directly under and contacting the first barrier layer comprising zinc, and a second layer comprising Ni and/or Cr located directly over and contacting the second barrier layer comprising zinc.

In the coated article of any of the preceding fourteen paragraphs, one or both of the barrier layers may further comprise silver.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A coated article including a coating supported by a glass substrate, the coating comprising:
    a first dielectric layer on the glass substrate;
    a first barrier layer comprising zinc that is metallic or substantially metallic on the glass substrate over at least the first dielectric layer;
    an infrared (IR) reflecting layer comprising silver on the glass substrate located over and directly contacting the first barrier layer comprising zinc;
    a second barrier layer comprising zinc that is metallic or substantially metallic on the glass substrate over and directly contacting the IR reflecting layer comprising silver, so that the IR reflecting layer comprising silver is located between and directly contacting the first and second barrier layers comprising zinc;
    another barrier layer comprising Ni and/or Cr located over and directly contacting the second barrier layer comprising zinc;
    a second dielectric layer on the glass substrate located over at least each of: the first and second barrier layers, the another barrier layer, and the IR reflecting layer; and
    wherein the coating has a sheet resistance ($R_s$) of no greater than 11 ohms/square and a normal emissivity ($E_n$) of no greater than 0.2.

2. The coated article of claim 1, wherein the IR reflecting layer consists essentially of silver.

3. The coated article of claim 1, wherein the IR reflecting layer is metallic or substantially metallic.

4. The coated article of claim 1, wherein the coated article has a visible transmission of at least 40%.

5. The coated article of claim 1, wherein the coated article has a visible transmission of at least 50%.

6. The coated article of claim 1, wherein the coated article has a light-to-solar gain ratio (LSG) of at least 1.10.

7. The coated article of claim 1, wherein the coated article has a light-to-solar gain ratio (LSG) of at least 1.20.

8. The coated article of claim 1, wherein the coated article has a light-to-solar gain ratio (LSG) of at least 1.30.

9. The coated article of claim 1, wherein the first dielectric layer comprises silicon nitride.

10. The coated article of claim 1, wherein the first barrier layer comprising zinc further comprises aluminum.

11. The coated article of claim 1, wherein the second barrier layer comprising zinc further comprises aluminum.

12. The coated article of claim 1, wherein the second dielectric layer comprises silicon nitride.

13. The coated article of claim 1, wherein the coating has a sheet resistance ($R_s$) of no greater than 9 ohms/square and a normal emissivity ($E_n$) of no greater than 0.11.

14. The coated article of claim 1, wherein the coating further comprises a second infrared (IR) reflecting layer comprising silver that is located between third and fourth metallic or substantially metallic barrier layers comprising zinc.

15. The coated article of claim 1, wherein the coating further comprises a layer comprising Ni and/or Cr located under and directly contacting the first barrier layer comprising zinc.

16. The coated article of claim 1, wherein metal content of the first and second barrier layers is at least 90% zinc.

17. The coated article of claim 1, wherein the first and second barrier layers comprising zinc are each from 15-40 Å thick.

18. The coated article of claim 1, wherein the first and second barrier layers comprising zinc are each from 17-33 Å thick.

19. A coated article including a coating supported by a glass substrate, the coating comprising:
    a first dielectric layer on the glass substrate;
    a first barrier layer comprising zinc that is metallic or substantially metallic on the glass substrate over at least the first dielectric layer;
    an infrared (IR) reflecting layer comprising silver on the glass substrate located over and directly contacting the first barrier layer comprising zinc;
    a second barrier layer comprising zinc that is metallic or substantially metallic on the glass substrate over and directly contacting the IR reflecting layer comprising silver, so that the IR reflecting layer comprising silver is located between and directly contacting the first and second barrier layers comprising zinc;
    a second dielectric layer on the glass substrate located over at least the first and second barrier layers, and the IR reflecting layer;
    wherein the coating has a sheet resistance ($R_s$) of no greater than 11 ohms/square and a normal emissivity ($E_n$) of no greater than 0.2; and
    wherein the coating further comprises a dielectric layer comprising zinc oxide located under and directly contacting the first barrier layer comprising zinc.

20. A coated article including a coating supported by a glass substrate, the coating comprising:
    a first dielectric layer on the glass substrate;
    an infrared (IR) reflecting layer comprising silver on the glass substrate located over at least the first dielectric layer;

a barrier layer comprising zinc that is metallic or substantially metallic on the glass substrate over and directly contacting the IR reflecting layer comprising silver;

another barrier layer comprising Ni and/or Cr on the glass substrate located over and directly contacting the barrier layer comprising zinc;

a second dielectric layer on the glass substrate located over at least the IR reflecting layer, the barrier layer comprising zinc, and the barrier layer comprising Ni and/or Cr; and wherein the coating has a sheet resistance ($R_s$) of no greater than 11 ohms/square and a normal emissivity ($E_n$) of no greater than 0.2.

21. The coated article of claim 20, wherein metal content of the barrier layer comprising zinc is at least 90% zinc.

22. The coated article of claim 20, wherein the coated article has a visible transmission of at least 40% and/or a light-to-solar gain ratio (LSG) of at least 1.10.

23. The coated article of claim 20, wherein the barrier layer comprising zinc further comprises aluminum.

24. The coated article of claim 20, wherein the barrier layer comprising zinc is from 15-40 Å thick.

25. The coated article of claim 20, wherein the barrier layer comprising zinc is from 17-33 Å thick.

26. The coated article of claim 20, wherein the barrier layer comprising Ni and/or Cr is nitrided.

27. The coated article of claim 20, further comprising a layer comprising zinc on the glass substrate over at least the first dielectric layer and located under and directly contacting the IR reflecting layer.

28. A method of making a coated article including a coating supported by a glass substrate, the method comprising:

depositing a first dielectric layer on the glass substrate;

depositing a first barrier layer comprising zinc that is metallic or substantially metallic on the glass substrate over at least the first dielectric layer;

depositing an infrared (IR) reflecting layer comprising silver on the glass substrate located over and directly contacting the first barrier layer comprising zinc;

depositing a second barrier layer comprising zinc that is metallic or substantially metallic on the glass substrate over and directly contacting the IR reflecting layer comprising silver, so that the IR reflecting layer comprising silver is located between and directly contacting the first and second barrier layers comprising zinc;

depositing another barrier layer comprising Ni and/or Cr located over and directly contacting the second barrier layer comprising zinc;

depositing a second dielectric layer on the glass substrate located over at least each of: the first and second barrier layers, the another barrier layer, and the IR reflecting layer; and wherein the coating has a sheet resistance ($R_s$) of no greater than 11 ohms/square and a normal emissivity ($E_n$) of no greater than 0.2.

29. The method of claim 28, wherein each of the layers is deposited via sputtering.

30. The method of claim 28, wherein at least one of the first and second barrier layers comprising zinc is from 15-40 Å thick.

31. The method of claim 28, wherein the first and second barrier layers comprising zinc are each from 17-33 Å thick.

32. A method of making a coated article including a coating supported by a glass substrate, the method comprising:

depositing a first dielectric layer on the glass substrate;

depositing an infrared (IR) reflecting layer comprising silver on the glass substrate located over at least the first dielectric layer;

depositing a barrier layer comprising zinc that is metallic or substantially metallic on the glass substrate over and directly contacting the IR reflecting layer comprising silver;

depositing another barrier layer comprising Ni and/or Cr located over and directly contacting the barrier layer comprising zinc;

depositing a second dielectric layer on the glass substrate located over at least the IR reflecting layer, the barrier layer comprising zinc, and the another barrier layer; and wherein the coating has a sheet resistance ($R_s$) of no greater than 11 ohms/square and a normal emissivity ($E_n$) of no greater than 0.2.

33. The method of claim 32, wherein metal content of the barrier layer comprising zinc is at least 90% zinc.

34. The method of claim 32, wherein the coated article has a visible transmission of at least 40% and/or a light-to-solar gain ratio (LSG) of at least 1.10.

35. The coated article of claim 32, wherein the barrier layer comprising zinc further comprises aluminum.

36. The method of claim 32, wherein said another barrier layer comprises a nitride of NiCr.

37. The method of claim 32, wherein the barrier layer comprising zinc further comprises silver.

* * * * *